United States Patent [19]
Asakura

[11] Patent Number: 5,091,887
[45] Date of Patent: Feb. 25, 1992

[54] DYNAMIC SEMICONDUCTOR MEMORY DEVICE

[75] Inventor: Mikio Asakura, Hyogo, Japan

[73] Assignee: Mitsubishi Denki Kabushiki Kaisha, Tokyo, Japan

[21] Appl. No.: 521,717

[22] Filed: May 11, 1990

[30] Foreign Application Priority Data

May 16, 1989 [JP] Japan ................................ 1-123129

[51] Int. Cl.$^5$ ............................................. G11C 13/00
[52] U.S. Cl. .................................... 365/206; 365/207; 365/189.01; 365/63
[58] Field of Search ................... 365/206, 207, 189.01, 365/63

[56] References Cited

U.S. PATENT DOCUMENTS 3,942,164  3/1976  Dunn .
5,001,669  3/1991  Cho et al. ............................ 365/207

OTHER PUBLICATIONS

Tsutomu Yoshihara et al., "A Twisted Bit Line Technique for Multi-Mb DRAMs", Digest of Technical Papers 1988, IEEE International Solid-State Circuits Conference (Feb. 1988) pp. 238, 239.

yasuji Nagayama et al., "Second Generation 1M-Bit Dynamic CMOS RAM" Mitsubishi Electric Company Technical Journal, vol. 62, No. 7 (1988) pp. 76-81.

Primary Examiner—Terrell W. Fears
Attorney, Agent, or Firm—Lowe, Price, LeBlanc & Becker

[57] ABSTRACT

A dynamic semiconductor memory device includes a memory cell array comprising a plurality of word lines ($WL_0$-$WL_n$), a plurality of bit lines ($BL_n$-$BL_{n+11}$) and a plurality of memory cells (MC) connected to intersections between the word lines and the bit lines. The plurality of bit lines include bit line pairs of two bit lines, one being a bit line for reading information of a memory cell, and the other being a bit line for providing a reference potential, and sense amplifiers (SA1-SA5) for detecting a potential difference between each bit line pair to amplify the same. The plurality of bit line pairs include bit line pairs crossing with each other such that a capacitance is balanced between adjacent bit lines, and bit line pairs having no crossing portion between which the bit line pairs crossing with each other are arranged such that a capacitance is balanced between said adjacent bit lines. Accordingly, the bit lines having the crossing portions receive the same noise from the other adjacent bit lines, and the bit lines having no crossing portion receive no noise between the paired bit lines, so that a reading potential difference can be reduced.

12 Claims, 4 Drawing Sheets

DYNAMIC SEMICONDUCTOR MEMORY DEVICE

BACKGROUND OF THE INVENTION

1. Field of the Invention

The present invention relates generally to dynamic semiconductor memory devices. More particularly, the present invention relates to dynamic semiconductor memory devices comprising memory cell arrays including a plurality of word lines, a plurality of bit lines and a plurality of memory cells connected to intersections of the word lines and the bit lines, the plurality of bit lines including bit line pairs each including a bit line for reading/writing information of a memory cell and a bit line for providing a reference potential, and further including sense amplifiers each connected to each bit line pair for detecting and amplifying a potential difference between the bit lines.

2. Description of the Background Art

FIG. 4 is a block diagram showing an arrangement of a major part of a conventional dynamic random access memory (referred to as DRAM hereinafter). Referring to FIG. 4, a plurality of bit line pairs BL0 and $\overline{BL0}$, and BL1 and $\overline{BL1}$ are arranged so as to intersect a plurality of word lines WL0 and WL1. Memory cells MC are connected at intersections between respective bit line pairs BL0 and $\overline{BL0}$, and BL1 and $\overline{BL1}$ and the word lines WL0 and WL1. Each memory cell MC includes a transfer gate TG comprising an N channel MOS transistor, and a capacitance Cs for storing information of a "H" (high) level or a "L" (low) level. Dummy word lines DWL0 and DWL1 are arranged so as to crossing the bit line pairs BL0 and $\overline{BL0}$, and BL1 and $\overline{BL1}$. Dummy cells DC0 are provided at intersections or crossing points between the dummy word line DWL0 and the bit lines BL0 and BL1, and dummy cells DC1 are provided at intersections between the dummy word line DWL1 and the bit lines $\overline{BL0}$ and $\overline{BL1}$. Intermediate potentials between a power supply potential Vcc and a ground potential is held in the dummy cells DC0 and DC1.

Sense amplifiers SA0 and SA1 are connected between the bit line pairs BL and $\overline{BL}$. The plurality of word lines WL0 and WL1, and the dummy word lines DWL0 and DWL1 are connected to a row decoder 101. The bit line pairs BL0 and $\overline{BL0}$, and BL1 and $\overline{BL1}$ are connected to a data input/output line pair I/O and $\overline{I/O}$ through transfer gates Q1 and Q2 comprising N channel MOS transistors. Gates of the transfer gates Q1 and Q2 are connected to a column decoder 102.

In data reading, for example, one word line WL0 is selected by the row decoder 101 so that its potential rises to the H level, whereby data in a memory cell MC connected to the word line WL0 is read out onto the bit line BL0 or $\overline{BL}$. For example, in reading the data onto the bit line BL0, a potential of the dummy word line DWL1 is raised to the "H" level so that a potential in the dummy cell DC1 is read out onto the bit line $\overline{BL0}$.

Therefore, a potential of the bit line $\overline{BL0}$ will be a reference potential Vref. On the other hand, a potential of the bit line BL0 will be slightly higher or lower than the reference potential Vref. Thereafter, a potential difference between the bit line pair BL0 and $\overline{BL0}$ is amplified by a sense amplifier SA0. Any one of the pairs of the transfer gates Q1 and Q2 is turned on by the column decoder 102, so that the data on the bit line pair BL0 and $\overline{BL0}$ connected thereto is read out onto the data input/output line pair I/O and $\overline{I/O}$. Now, a potential appearing on each bit line pair BL0 and $\overline{BL0}$ in data reading will be considered.

FIG. 5 is a diagram showing a capacitance existing between the bit lines BL and $\overline{BL}$, and a ground potential in a conventional DRAM. Referring to FIG. 5, a capacitance C1 exists between the bit lines BL and $\overline{BL}$, and the ground potential (a fixed potential) through a substrate and a capacitance C2 exists between adjacent bit lines BL and $\overline{BL}$. A cell capacitance of a memory cell MC connected at an intersection between a bit line BL and a word line WL is referred to as Cs.

A charge stored in a memory cell MC will be CsVcc (writing of Vcc) when data of the "H" level is stored, and will be 0 (writing of 0V) when data of the "L" level is stored. In addition, a charge of CsVcc/2 (writing of Vcc/2) is stored in the dummy cells DC0 and DC1. When the bit line pairs BL and $\overline{BL}$ are to be precharged to Vcc/2 before reading operation, charges on the bit lines BL and $\overline{BL}$ will be C1Vcc/2.

In FIG. 4 described above, for example, when data is read out from a memory cell MC to the bit line BL1 and a potential from the dummy cell DC is read out onto the bit line $\overline{BL1}$, a potential $V_{BL1}$ of the bit line BL1 and a potential $V_{\overline{BL1}}$ of the $\overline{BL1}$ are obtained from the following equation, respectively $$C1Vcc/2 + Cs\,(\tfrac{1}{2} \pm \tfrac{1}{2})\,Vcc = C1V_{BL1} + C2(V_{BL1} - V_{\overline{BL0}}) + C2(V_{BL1} - V_{\overline{BL1}}) + CsV_{BL1} \quad (1)$$

(+ is for a case where the Vcc is written and − is for a case where 0 voltage is written)

$$C1Vcc/2 + CsVcc/2 = C1V_{\overline{BL1}} + C2(V_{\overline{BL1}} - V_{BL2}) + C2(V_{\overline{BL1}} - V_{BL1}) + CsV_{\overline{BL1}} \quad (2)$$

wherein $V_{\overline{BL0}}$ is a potential of the bit line $\overline{BL0}$ and $V_{BL2}$ is a potential of the bit line BL2. In the following, it will be explained assuming that the data of the high level is read out onto the bit lines BL0, BL1 and BL2, the equation $V_{BL0} \approx V_{BL1} \approx V_{BL2}$, $V_{\overline{BL0}} \approx V_{\overline{BL1}} \approx V_{\overline{BL2}}$ is given. Substituting the equation for the equation (1) and the equation (2), a potential difference $\Delta V_{BL1}$ $(=V_{BL1} - V_{\overline{BL1}})$ between the bit lines BL1 and $\overline{BL1}$ will be represented by the following equation (3), $$\Delta V_{BL1} \approx CsVcc/\{2\,(C1 + 4C2 + Cs)\} \quad (3)$$

wherein the coefficient "4" for C2 represents 2 for a capacitance generated even if adjacent bit lines have a fixed potential, 1 for a noise between paired bit lines, and 1 for a contribution of a noise received from the adjacent bit line pairs. If the distance between bit lines is reduced as a result of increased integration of memory device, the capacitance C2 between the bit lines is increased, so that a denominator of the equation (3) becomes larger. Therefore, a potential difference between the bit line pair BL and $\overline{BL}$ in reading becomes smaller due to a capacitive coupling noise between the adjacent bit lines, reducing a reading margin. As a result, sense amplifiers malfunction, thereby increasing a soft error rate.

A twisted bit line structure for reducing a capacitive coupling noise between bit lines is proposed in "A Twisted Bit Line Technique for Multi-Mb DRAMs", 1988 IEEE International Solid-State Circuits Conference, DIGEST OF TECHNICAL PAPERS, pp. 238-239, which will be described in the following.

FIG. 6 is a diagram showing a twisted bit line structure. Referring to FIG. 6, bit lines BL are divided into four, and bit lines of each of bit line pairs intersects with each other at two of the dividing points. A first pair of bit lines BL0 and $\overline{BL0}$ intersect with each other at two dividing points which are a ¼ point and an end point, and a second bit line pair BL1 and $\overline{BL1}$ intersect with each other at two points which are a ¼ point and a ¾ point. A pattern of a basic unit is repeated with the two pairs of bit lines as a basic unit. Intersection at an end of a bit line is for overcoming an unbalance produced in capacitances and resistances between the paired bit lines.

Now, calculating a reading potential difference $\Delta V_{BL1}(=|V_{BL1}-V_{\overline{BL1}}|)$ between, for example, the bit line pair BL1 and BL1, from the following equation, $$C1Vcc/2+(\tfrac{1}{4}\pm\tfrac{1}{4})\,CsVcc=C1V_{BL1}+CsV_{BL1}+C2(V_{BL1}-V_{\overline{BL1}})+C2/4\{(V_{BL1}-V_{BL0})+(V_{BL1}-V_{\overline{BL0}})+(V_{BL1}-V_{BL2})+(V_{BL1}-V_{\overline{BL2}})\}$$

$$C1Vcc/2 + CsVcc/2 = C1V_{BL1} + CsV_{BL1} + C2(V_{BL1} - V_{BL1}) + C2/4\{(V_{BL1} - V_{BL0}) + (V_{BL1} - V_{BL0}) + (V_{BL1} - V_{BL2}) + (V_{BL1} - V_{BL2})\}$$

the following equation will be obtained, $$V_{BL1}=CsVcc/\{2\,(C1+3C2+Cs)\} \qquad (4)$$

and when compared with the equation (3), the coefficient for the denominator C2 is as small as 3. This is because a noise from the adjacent bit line pairs is cancelled. More specifically, it is appreciated that a reading potential difference becomes larger.

In this arrangement, however, regions are necessary in which bit lines intersect with each other at four or three points, resulting in increase of a chip area.

In addition, in the prior art shown in FIG. 4, dummy bit lines should be arranged at the opposite ends of a memory cell array to prevent an unbalance produced in a capacitance between the bit lines at ends of the memory cell array, which is described in U.S. Pat. No. 4,551,820.

In addition, usually a word line has a high resistivity and a delay difference between signals at the opposite ends of the word line is large. In order to avoid the delay difference it becomes common that in a large capacity DRAM, an interconnection having a low resistivity (for example aluminum) is arranged on a word line so that the interconnection comes into contact with the word line (lining of a word line) at several points in the array, which is described, for example, in "Mitsubishi Electric Company Technical Journal" Vol. 62, No. 7 (1988) pp 76-81. In this case, unbalance is caused also in a capacitance between a bit line pair adjacent to a lining portion. A dummy bit line is required also in this portion in order to avoid the unbalance.

As shown in FIG. 4, in a conventional dynamic semiconductor memory device, as the integration of the device and, a capacitance between adjacent bit lines are increased, there is possibilities that a reading potential difference is reduced due to a capacitive coupling noise between adjacent bit lines, so that a soft error rate is deteriorated, and a reading margin is reduced, resulting in a malfunction. In order to solve the problems, a chip area is increased, as shown in FIG. 6.

SUMMARY OF THE INVENTION

An object of the present invention is to provide a dynamic semiconductor memory device in which increase of a chip area can be limited and reduction of a reading potential difference due to a noise between adjacent bit lines caused by a capacitance between bit lines can be controlled as much as that of twisted bit lines.

Briefly stated, the present invention is a dynamic semiconductor memory device including a memory cell array comprising a plurality of word lines, a plurality of bit lines and a plurality of memory cells connected at intersections between the word lines and the bit lines, the plurality of bit lines including bit line pairs each including a bit line for reading information of a memory cell and a bit line for providing a reference potential, and further including sense amplifiers each detecting and amplifying a potential difference between paired bit lines, the plurality of bit line pairs including a bit line pair crossing with each other such that a capacitance is balanced between adjacent bit lines and a bit line pair having no intersecting portion between which the bit line pair crossing such that a capacitance is balanced between the adjacent bit lines balance is arranged.

Accordingly, according to the present invention, each of the bit line pair having the crossing portions receives the same noise from other adjacent bit lines, and each of the bit line pair having no crossing portion receives none of a noise generated between the paired bit lines, so that a reading potential difference can be reduced.

In a more preferred embodiment of the present invention, by making the bit line pairs adjacent to the bit line pairs having no crossing portion to be the bit lines of the bit line pairs having the crossing portions, a noise generated between bit lines is reduced, so that the sense amplifiers are less likely to malfunction.

In addition, in a more preferred embodiment of the present invention, as a bit line pair arranged at the opposite ends of the memory cell array has interconnecting portions, that a dummy bit line becomes unnecessary.

In addition, in a more preferred embodiment of the present invention, by disposing a bit line pair having crossing portions adjacent to the opposite ends of the memory cell array and lining portions of the word lines, dummy bit lines should not be provided at the lining portions of the word lines.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
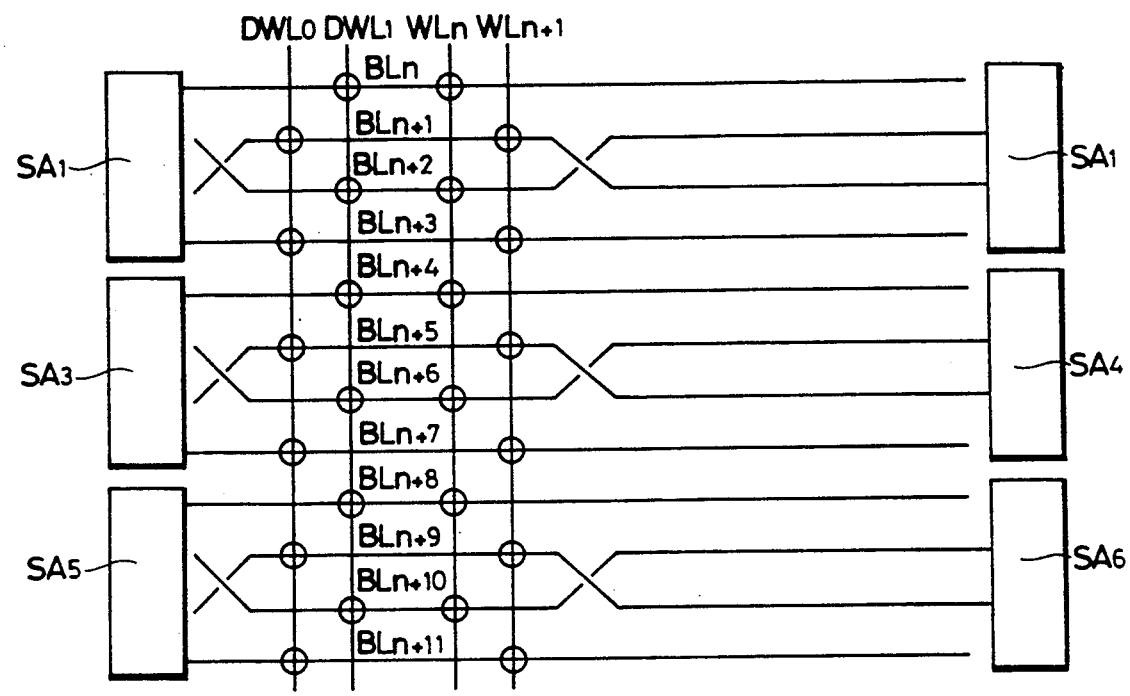
FIG. 1 is a diagram showing an example of an arrangement of bit line pairs according to one embodiment of the present invention.

FIG. 1 is a diagram showing an arrangement of bit line pairs and sense amplifiers included in one embodiment of the present invention. Referring to FIG. 1, circles at crossing points between word lines $WL_n$, $WL_{n+1}$ and bit lines $BL_n$-$BL_{n+11}$ indicate memory cells and circles at crossing points between dummy word lines DWL0 and DWL1, and the bit lines $BL_n$-$BL_{n+11}$ indicate dummy cells. Respective bit lines $BL_n$-$BL_{n+11}$ are connected to sense amplifier SA1-SA6. It is assumed that a charge of Cs Vcc/2 (writing of Vcc/2 in a capacitance of Cs) is stored in each dummy cell. The bit lines $BL_n$ and $BL_{n+3}$, and $BL_{n+1}$ and $BL_{n+2}$ are respectively paired, each being connected to a sense amplifiers SA. The bit line $BL_{n+1}$ and $BL_{n+2}$ intersect with each other at a center portion and end portions, which pattern such as that of the bit lines $BL_n$-$BL_{n+3}$ is repeated. Intersections at the end portions are directed to make a balance between paired bit lines, which is not necessarily required.

With the bit lines $BL_n$-$BL_{n+11}$ arranged as described above, reading potential differences of the bit line pairs $BL_{n+4}$ and $BL_{n+3}$, and $BL_{n+5}$ and $BL_{n+6}$ are respectively calculated. Now, consider a case where the data of the "H" level is written into all the memory cells. This is the case where a noise received from adjacent bit lines becomes the largest, that is, the worst case. A potential difference $\Delta V_{BL1}$ between $BL_{n+4}$ and $BL_{n+7}$ will be from, $$C1Vcc/2 + CsVcc = C1V_{BLn+4} + CsV_{BLn+4} + C2(V_{BLn+4} - V_{BLn+3}) + C2/2\{(V_{BLn+4} - V_{BLn+5}) + (V_{BLn+4} - V_{BLn+6})\},$$

$$C1Vcc/2 + CsVcc/2 = C1V_{BLn+7} + CsV_{BLn+7} + C2(V_{BLn+7} - V_{BLn+8}) + C2/2\{(V_{BLn+7} - V_{BLn+5}) + (V_{BLn+7} - V_{BLn+6})\}$$

and $V_{BLn+4} \approx V_{BLn+8}$, $V_{BLn+3} \approx V_{BLn+7}$ as the following equation, $$\Delta V_{BL1} (= V_{BLn+4} - V_{BLn+7}) \approx CsVcc/\{2(C1+3C2+Cs)\} \quad (5)$$

and a potential difference $\Delta V_{BL2}$ between the bit line $BL_{n+5}$ $BL_{n+6}$ will be from, $$C1Vcc/2 + CsVcc = C1V_{BLn+6} + CsV_{BLn+6} + C2(V_{BLn+6} - V_{BLn+5}) + C2/2 \{(V_{BLn+6} - V_{BLn+4}) + (V_{BLn+6} - V_{BLn+7})\}$$

$$C1Vcc/2 + CsVcc/2 = C1V_{BLn+5} + CsV_{BLn+5} + C2(V_{BLn+5} - V_{BLn+6}) + C2/2 \{(V_{BLn+5} - V_{BLn+4}) + (V_{BLn+5} - V_{BLn+7})\}$$

as the following equation.

$$\Delta V_{BL2} (= V_{BLn+6} - V_{BLn+5}) \approx CsVcc/\{2(C1+3C2+Cs)\} \quad (6)$$

The equation (5) and (6) are the same as the equation (4) obtained in the twisted bit line structure, wherein a noise between paired bit lines is cancelled in the equation (5) and a noise received from the adjacent bit line pairs is cancelled in the equation (6). It will be understood that in such a structure the same effect as that obtained in the twisted bit line structure can be obtained with respect to a reading potential difference.

Figure 2:
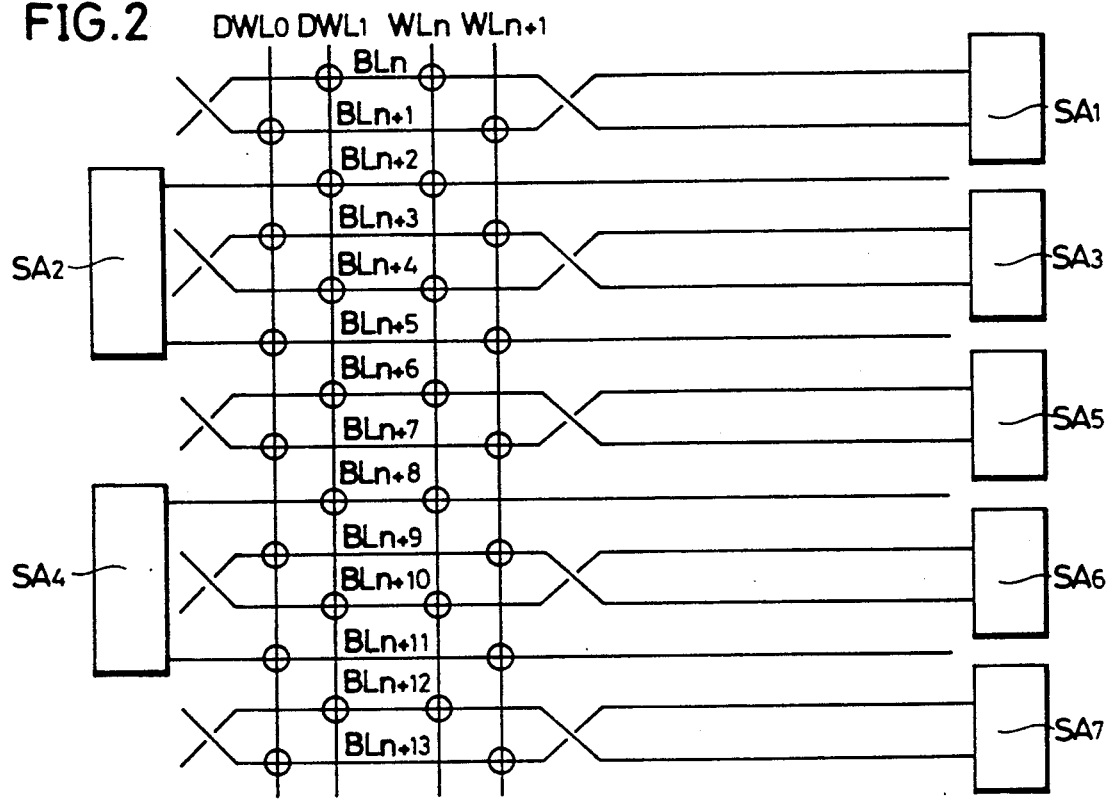
FIG. 2 a diagram showing an example of an arrangement of bit line pairs according to another embodiment of the present invention.

FIG. 2 is a diagram showing another embodiment of the present invention. Referring to FIG. 2, in the embodiment, a basic pattern is formed by three pairs of bit line pairs including two pairs of bit lines $BL_n$ and $BL_{n+1}$, and $BL_{n+3}$ and $BL_{n+4}$ having crossing portions at the center and at ends thereof, and a bit line pair $BL_{n+2}$ and $BL_{n+5}$ having no crossing portion. The bit line pair $BL_{n+3}$ and $BL_{n+4}$ having the crossing portions is arranged between the bit line pair $BL_{n+2}$ and $BL_{n+5}$ having no crossing portion, and the bit line pair $BL_n$ and $BL_{n+1}$ having the crossing portions is arranged adjacent to the bit line $BL_{n+2}$. The bit lines $BL_n$ and $BL_{n+1}$ having the crossing portions are connected to a sense amplifier SA1, and the bit line pair $BL_{n+3}$ and $BL_{n+4}$ is connected to a sense amplifier SA3, and the bit lines $BL_{n+2}$ and $BL_{n+5}$ are connected to a sense amplifier SA2.

Now, a reading potential difference in the embodiment shown in FIG. 1 will be calculated in the same manner as the embodiment shown in FIG. 2. The bit lines $BL_n$ and $BL_{n+1}$, and $BL_{n+3}$ and $BL_{n+4}$ having the crossing portions are exactly the same as those in the embodiment shown in FIG. 1, and making a calculation on the bit line pair $BL_{n+2}$ and $BL_{n+5}$ having no crossing portion, a reading potential difference $\Delta V_{BL}$ will be from, $$C1Vcc/2 + CsVcc = C1V_{BLn+2} + CsV_{BLn+2} + C2/2 \{V_{BLn+2} - V_{BLn}) + (V_{BLn+2} + V_{BLn+1}) + (V_{BLn+2} - V_{BLn+3}) + (V_{BLn+2} - V_{BLn+4})\},$$

$$C1Vcc/2 + CsVcc/2 = C1V_{BLn+5} + CsV_{BLn+5} + C2/2\{(V_{BLn+5} - V_{BLn+3}) + (V_{BLn+5} - V_{BLn+4}) + (V_{BLn+5} - V_{BLn+6}) + (V_{BLn+5} - V_{BLn+7})\}$$

as the following equation, $$\Delta V_{BL} \approx CsVcc/\{2(C1+3C2+Cs)\} \quad (7)$$

wherein it is assumed that the "H" level is written in the bit lines $BL_{n+2}$ and $BL_{n+6}$ and the "L" level is written in the bit line $BL_n$, and $V_{BLn+1} - V_{BLn} \approx V_{BLn+6} - V_{BLn+7}$ and $V_{BLn+1} \approx V_{BLn+7}$ are used. In this case, reading potential difference is minimum. As obvious from the above described equation (7), the same reading potential difference as that of the equation (6) in the embodiment shown in FIG. 1 can be obtained.

In the above described embodiment shown in FIG. 1, when the sense amplifiers operate, there exists a noise received through a coupling capacitance from the adjacent bit lines. Take bit line pair BLn+4 and BLn+7 as an example, in case the word line WLn is selected, so that data of "H" is read out onto the bit lines BLn, BLn+4 and BLn+8. In this case, where the sense amplifiers operate, while the potential on the bit line BLn+3 tends to fall, the potential on the bit line BLn+8 tends to rise. As a result, the bit line BLn+4 receives noise in the direction of a potential fall and the bit line BLn+7 receives noise in the direction of a potential rise. On the other hand, in the embodiment shown in FIG. 2, when the sense amplifiers operate, a noise received through a coupling capacitance from the adjacent bit lines is the same in the paired bit line, so that the same amplifiers can be less likely to malfunction. With bit line pairs having crossing portions being arranged at the opposite ends of the memory cell array, there occurs no capacitive unbalance between the bit line pair at the end of the memory cell array, so that a dummy bit line becomes unnecessary. In addition, in a structure of linings of word lines, a space between the bit lines is wide at a lining portion, so that a noise between the bit lines thereof should not be considered. Then, by arranging the bit line pair having the crossing portions at the opposite ends of a block which is between the lining portions, the dummy bit line required at the lining portion becomes unnecessary, resulting in a sharp cut of dummy bit lines.

In the foregoing description, although the crossing portions are arranged at the center and the opposite ends of the bit line, it is obvious that the same effect can be obtained as long as a space between the crossing portions is a half the bit line length.

Figure 3:
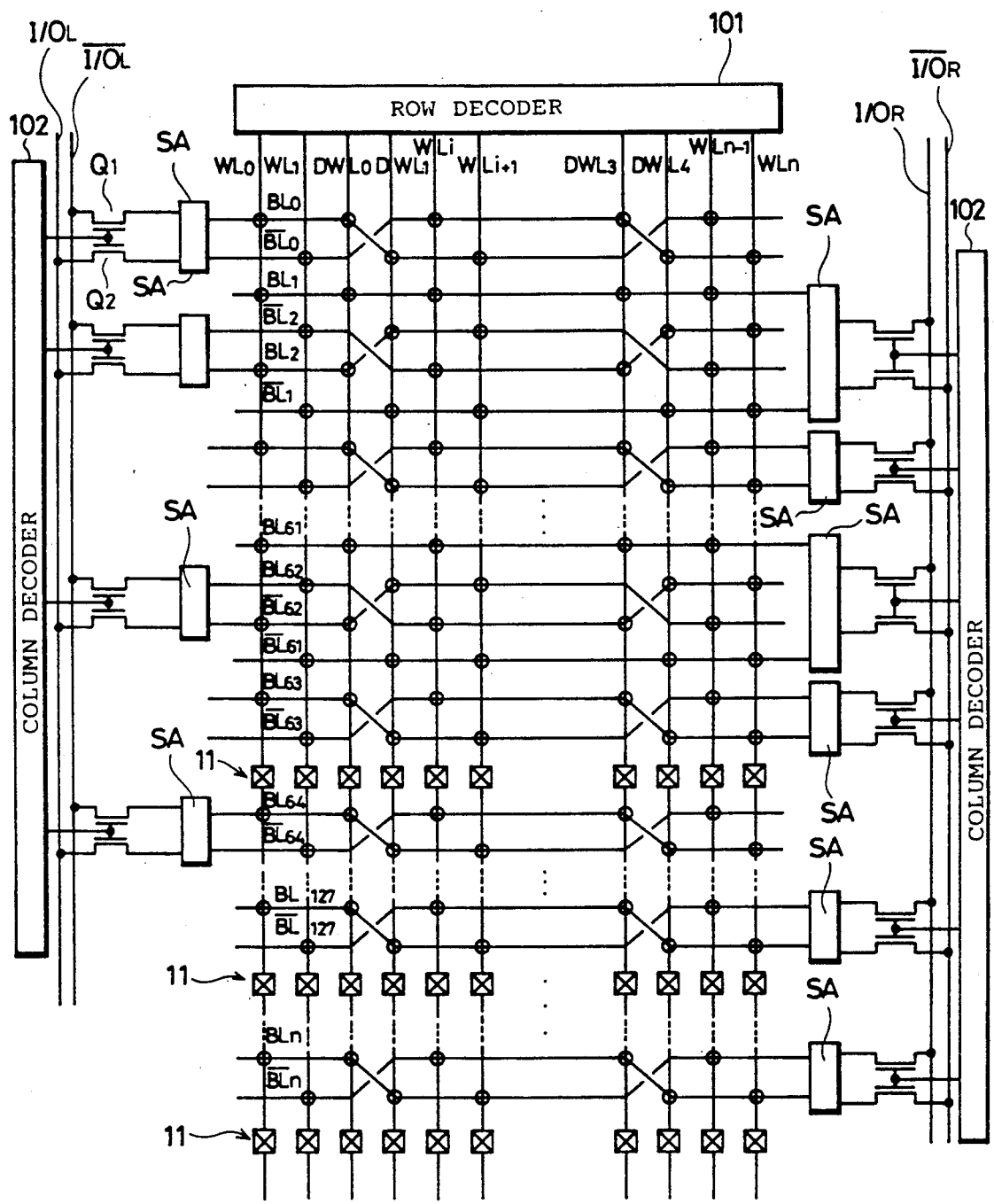
FIG. 3 is a diagram showing an example of an arrangement of bit line pairs according to a further embodiment of the present invention.
Figure 4:
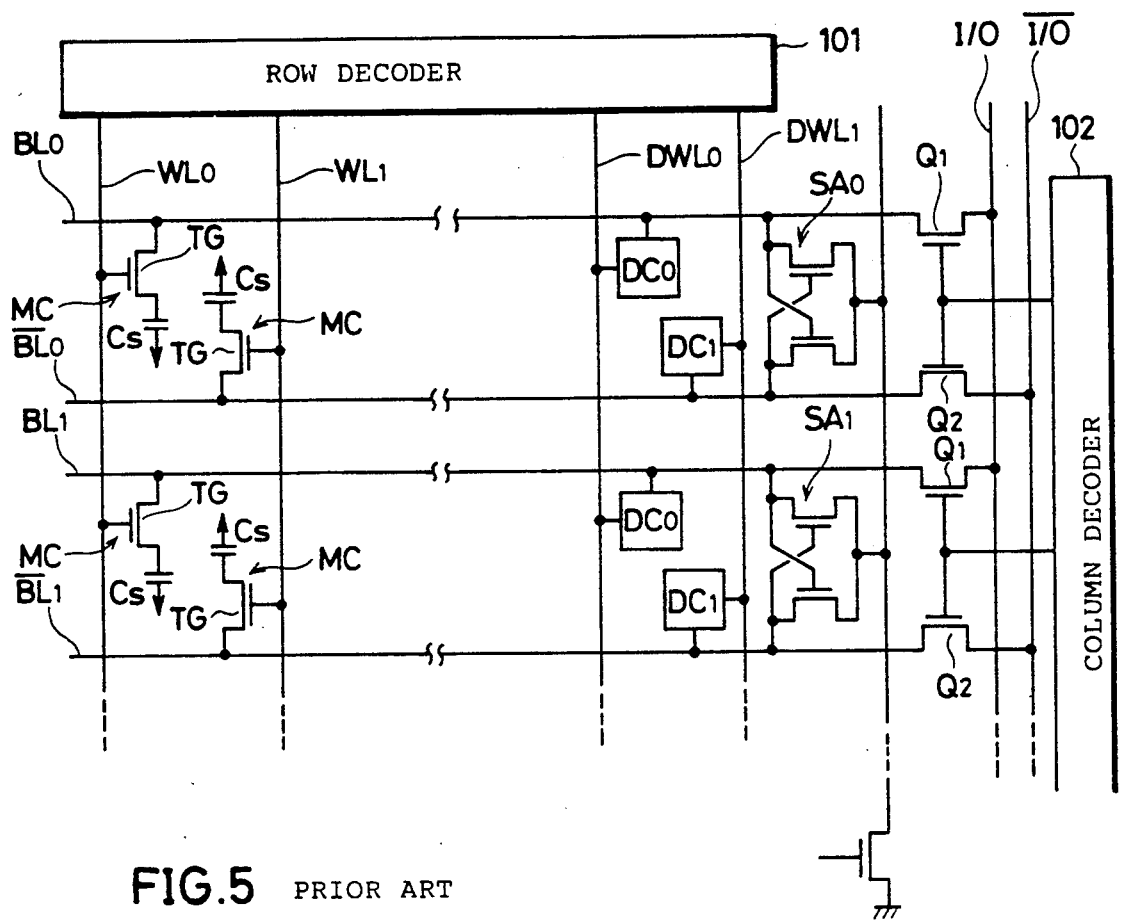
FIG. 4 is a block diagram showing a main part of a conventional DRAM.
Figure 5:
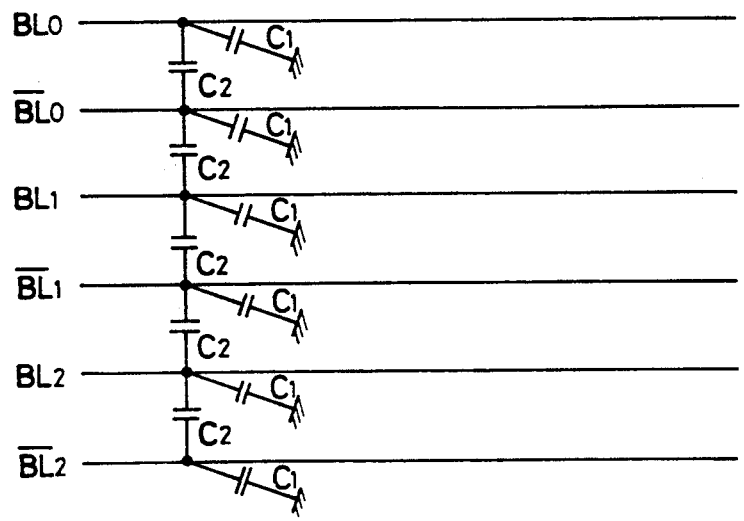
FIG. 5 is a diagram showing a capacitance between the bit lines.
Figure 6:
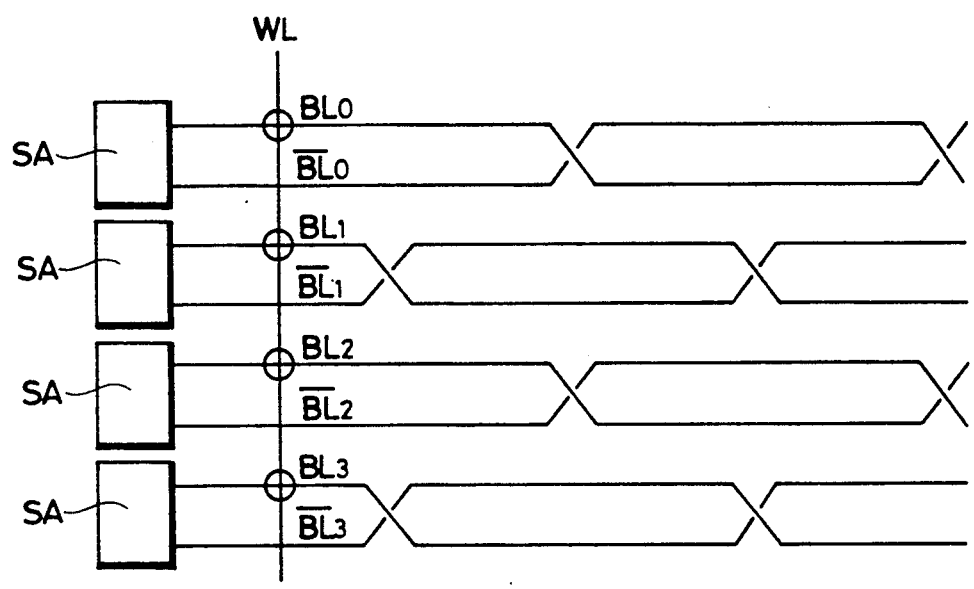
FIG. 6 is a diagram showing a structure of a twisted bit line.

FIG. 3 is a diagram showing a further embodiment of the present invention. Although the bit line pairs $BL_0$ and $\overline{BL_0}$, and $BL_2$ and $\overline{BL_2}$ having the crossing portions and the bit line pair $BL_1$ and $\overline{BL_1}$ having no crossing portion are arranged in the same manner as the embodiment shown in FIG. 2, the bit lines intersect with each other at points of one-forth and three-forth of the length of the bit line, and the word lines $WL_0$, $WL_1$, $WL_i$, $WL_{i+1}$, $WL_{n-1}$, $WL_n$ and the dummy word lines $DWL_0$, $DWL_1$, $DWL_3$ and $DWL_4$ have linings at lining portions 11. Two of the dummy word lines $DWL_0$, $DWL_1$, $DWL_3$ and $DWL_4$ are arranged at each crossing portion, and when the word line $WL_0$ or $WL_{n-1}$ is selected, the dummy word line $DWL_4$ is selected, when the word line $WL_1$ or $WL_n$ is selected, the dummy word line $DWL_0$ is selected, when the word line $WL_i$ is selected, the dummy word line $DWL_1$ is selected, and when the word line $WL_{i+1}$ is selected, the dummy word line $DWL_3$ is selected.

In addition, a bit line pair having crossing portions is arranged as a bit line pair being at the opposite ends of the array and adjacent to the word line lining portion 11. Being structured like this, the embodiment requires no dummy bit lines and arrangement of the dummy word lines $DWL_0$, $DWL_1$, $DWL_3$ and $DWL_4$ at the crossing portions with the bit lines allows reduction of a chip area. Although in the embodiment, 64 bit line pairs are arranged between the lining portions, the number of the bit lines is not limited to the above. In addition, no lining is necessary at an end portion of the word line, nor the number of bit line pairs in each block be equal.

Although in the above described embodiments, a capacitance is Cs and Vcc/2 is written in the dummy cell, others may be possible. In addition, although in the embodiment shown in FIG. 3, the sense amplifiers SA are arranged at the opposite sides of the bit lines, they may be not necessarily arranged at the opposite sides thereof.

As described in the foregoing, according to one embodiment of the present invention, bit line pairs crossing with each other such that capacitances are balanced between adjacent bit lines are arranged between bit line pairs having no crossing portion, so that influence from the adjacent bit lines can be reduced between the paired bit lines. In addition, a potential difference between paired bit lines can be reduced during data reading and a reading margin can be increased by reducing the increase of a chip area, so that a soft error rate can be improved. Furthermore, since the bit line pairs adjacent to the bit line pairs having no crossing portion are the bit lines of the bit line pairs having crossing portions, the sense amplifiers can be less likely to malfunction. In addition, the bit line pairs having the crossing portions are arranged at the opposite ends of the memory cell array, so that the dummy bit lines become unnecessary. In addition, in a structure in which the word lines have linings of interconnecting layers of a low resistivity at a plurality of points, by arranging the bit line pairs having crossing portions adjacent to the lining portions of the word lines, provision of the dummy bit lines adjacent to the lining portions becomes unnecessary.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device comprising:
   a memory cell array including a plurality of word lines, a plurality of bit lines and a plurality of memory cells (MC) connected to the intersections between the word lines and the bit lines, said plurality of bit lines comprising bit line pairs each including a bit line for reading information of said memory cell and a bit line for providing a reference potential,
   sense amplifiers for detecting and amplifying a potential difference between the bit lines in each bit line pair,
   said plurality of bit line pairs comprising:
      a first bit line pair having bit lines crossing with each other such that a capacitance is balanced between adjacent bit lines, and
      a second bit line pair having bit lines arranged approximately parallel to each other, said bit lines of said second bit line pair having said first bit line pair therebetween, said first bit line pair being arranged between the bit lines of said second bit line pair.

2. A dynamic semiconductor memory device according to claim 1, wherein
   bit lines adjacent to a bit line of said second bit line pair, comprises at least one bit line of said second bit line pair and a third bit line pair having crossing portions.

3. A dynamic semiconductor memory device according to claim 2, wherein
   bit line pairs arranged at opposite ends of the memory cell array comprise crossing portions.

4. A dynamic semiconductor device according to claim 1, wherein
   bit line pairs arranged at opposite ends of the memory cell array and adjacent to portions of the word lines having a lining of conductive material thereon comprise bit lines having crossing portions.

5. A dynamic semiconductor memory device according to claim 1, wherein
   each bit line pair of said first bit line pair is arranged between bit lines of a bit line pair of said second bit line pair.

6. A dynamic semiconductor memory device according to claim 1, wherein
a bit line pair of said first bit line pair is arranged between bit lines of adjacent pairs of bit lines of said second bit line pair, and
another bit line pair of said first bit line pair is arranged between bit lines of a bit line pair of said second bit line pair.

7. A dynamic semiconductor memory device according to claim 1, wherein
said bit line pairs are grouped into groups containing two bit line pairs of said first bit line pair and one bit line pair of said second bit line pair.

8. A dynamic semiconductor memory device according to claim 1, wherein
one bit line pair of said first bit line pair is arranged adjacent to a portion of said word lines in which said word lines are lined with a highly conductive material.

9. A dynamic semiconductor memory device having memory cells arranged in a matrix at intersections of word lines and bit lines and wherein said bit lines are arranged in pairs of said bit lines, the improvement comprising:
said bit line pairs being of a first type having at least one portion in which the bit lines intersect with each other and a second type having bit lines arranged approximately parallel to each other,
at least one said bit line pair of said first type being separated from another bit line pair of said first type by at least one bit line of a bit line pair of said second type.

10. A dynamic semiconductor memory device having memory cells arranged in a matrix at intersections of word lines and bit lines and wherein said bit lines are arranged in pairs of said bit lines, the improvement comprising:
said bit line pairs being of a first type having at least one portion in which the bit lines intersect with each other and a second type of bit line pair having bit lines arranged approximately parallel to each other,
at least one bit line of a pair of bit lines of said second type being adjacent to a bit line pair of said first type.

11. A dynamic semiconductor memory device according to claim 10, wherein said bit lines of a bit line pair of said second type are separated from each other by bit line pairs of said first type.

12. A dynamic semiconductor memory device according to claim 10, wherein crossing portions of said first type of bit line pair are separated from each other by one half a length of said bit line pair.

* * * * *